United States Patent [19]

McNaughton et al.

[11] Patent Number: 4,480,251

[45] Date of Patent: Oct. 30, 1984

[54] APPARATUS TO MONITOR ELECTRICAL CABLES, INCLUDING SPLICE JOINTS AND THE LIKE, FOR THE INGRESS OF MOISTURE

[75] Inventors: John P. McNaughton; Wayne E. Domenco; David E. Vokey, all of Winnipeg, Canada

[73] Assignee: Norscan Instruments Ltd., Winnipeg, Canada

[21] Appl. No.: 530,741

[22] Filed: Sep. 9, 1983

Related U.S. Application Data

[63] Continuation of Ser. No. 256,027, Apr. 21, 1981, abandoned.

[30] Foreign Application Priority Data

Apr. 22, 1980 [GB] United Kingdom ................. 8013148

[51] Int. Cl.³ .............................................. G08B 21/00
[52] U.S. Cl. ................................ 340/604; 73/40.5 R; 179/175.3 F; 324/52; 340/605; 340/620
[58] Field of Search ............... 340/602, 604, 605, 620; 324/52; 179/175.3 F; 73/40.5 R, 49.1, 49.5

[56] References Cited

U.S. PATENT DOCUMENTS

| 2,056,085 | 9/1936 | Alles | 340/604 X |
| 2,759,175 | 8/1956 | Spalding | 340/605 X |
| 3,721,898 | 3/1973 | Dragoumis et al. | 340/605 X |
| 3,882,476 | 5/1975 | Löfgren | 340/602 X |
| 4,297,686 | 10/1981 | Tom | 340/604 |

Primary Examiner—John W. Caldwell, Sr.
Assistant Examiner—Daniel Myer
Attorney, Agent, or Firm—Stanley G. Ade

[57] ABSTRACT

Apparatus for monitoring electrical cables for the presence of moisture within the cable along the full length of the cable and at specific points such as splices along its length comprises a pair of dielectrically separated conductors arranged along the length of the cable for communicating between a central station and remote stations along the length of the cable at the specific points to be monitored. The remote stations each include a further dielectrically separated pair of conductors for sensing moisture at the point and signals along the first pair of conductors to the central station. The central station detects moisture by an increase in current in the conductors and also detects a signal from remote stations. Branch cables spliced into the main cable include dielectrically separated conductors also spliced into the main conductors with the remote station at the splice including means for disconnecting the branch cable conductors from the main cable conductor under control from a signal from the central station.

9 Claims, 5 Drawing Figures

APPARATUS TO MONITOR ELECTRICAL CABLES, INCLUDING SPLICE JOINTS AND THE LIKE, FOR THE INGRESS OF MOISTURE

This application is a Continuation Application of application, Ser. No. 256,027, filed Apr. 21, 1981 and now abandoned.

BACKGROUND

One of the more serious concerns of telephone companies is the prevention of moisture penetration into outside cable plant. For the past fifteen to twenty years the main defensive mechanism has been the use of "pressurization". Pressurization has proven invaluable; however, as it is a physical system, it is limited by the pneumatic resistance of the cable and is often difficult to maintain. Due to practical considerations the use of air pressure protection systems is limited to the larger feeder and trunk cables. In instances where filled telecommunication cables are used in conjunction with non-filled cable types, pressurization can be extremely difficult if not physically impossible. The monitoring and protection system described within is an electronic system and therefore not subject to the constraints limiting a physical protection system such as pressurization. The invention offers much in simplicity and economy and may be incorporated in all types of cable plants, cables large and small, filled and unfilled.

The invention as designed, does not prevent or retard the ingress of moisture. It does, however, react instantly to its presence and provides for pin-pointing the location of the breach. Except in cases of catastrophic failure, the system provides warning and facilitates remedial action before outages occur.

The present invention is an electronic system which continuously monitors outside cable plant for the presence of moisture in cables or at splices, repeater sites, and other critical locations. At the first trace of moisture an alarm is activated and the system indicates clearly whether the cause is a cable sheath or other fault. The general monitoring system operates over a special moisture detection tape which is an integral part of the cable construction.

In accordance with the invention there is provided apparatus for monitoring electrical cables and specific locations therealong, such as splice joints and the like, against the ingress of moisture and including a source of electrical power; comprising in combination a pair of main separate and dielectrically isolated monitoring conductors operatively installed along the cable being monitored and being operatively connected to the source of electrical power, a terminating resistor across the distal ends of said monitoring conductors to ensure continuity of current through said monitoring conductors, thereby verifying the continuity thereof, and electronic detection means operatively connected to said monitoring conductors, said electronic detection means including indicating means to signal a lack of current continuity through said monitoring conductors and further indicating means to signal an increase of current flowing in said monitoring conductors, beyond a predetermined value due to a lessening of the resistance of the insulating dielectric between the two monitoring conductors, as by the presence of moisture.

A further advantage of the invention is to provide a device of the method and character herewithin described which is well suited to the purpose for which it is designed.

THEORY OF OPERATION

1. Fundamentally the invention operates by detecting the increase in conductance that occurs when a water path exists between two separate and isolated conductors. A monitoring voltage is impressed between two detecting conductors, which may take the form of a moisture detecting tape with two metallic conductors laminated to an insulating substrate. In order to insure the continuity and therefore secure operation of the system the far end of the detection conductors is terminated in a fixed resistance of a large value. The terminating resistor causes a small current to flow continuously through the detection conductors and this verifies the continuity of the monitoring line. Should the line open resulting in a loss of protection, the absence of the monitoring current will signal an alarm indicating a system fault. The ingress of water into the cable system will dampen or moisten the insulating dielectric between the detecting conductors and result in an increased current in the monitoring line. The increase in current is detected by the electronics at the equipment office and an alarm is activated signalling the presence of moisture. The moisture detection conductors are accessible at the equipment office and by employing well known bridge techniques the exact location of the breach may be determined. The sensitivity of the system to changes in current, as related to a break in the monitoring line or dampening or moistening of the monitoring line, is adjustable over a wide range. The nominal monitoring line current as determined by the termination resistance falls into a safe current "window". Should the line current exceed the preset maximum or minimum current level, an alarm is signalled which identifies the presence of moisture or loss of protection.

2. In addition a practical cable system may be constructed with several branch cables extending from a main cable run. At the point of a branch cable run, the detection line on the branch cable is bridged across the detection line on the main cable run, through a remote disconnect unit. The remote disconnect unit provides the facility for sectionalizing and isolating branch cable runs or at locations wherever system isolation is required. The remote disconnect unit forms part of the total monitoring system and is powered and signalled from the equipment office on one dedicated conductor pair. A number of disconnect devices may be tied to the same dedicated conductor pair as they are uniquely addressable by means of modulation coding. It is therefore possible to parallel several monitoring lines on one main cable monitoring line and remotely disconnect those lines for purposes of fault locating. In the event of a break in the monitoring line or the entry of moisture, the faulting cable section is determined by cyclically selecting and transmitting the signalling codes to each remote disconnect unit. Activating a particular remote disconnect unit causes the monitoring line associated with the unit, to be replaced by a nonfaulted line simulation. When substitution results in clearing of the alarm it is obvious that the faulty cable section has been isolated.

3. Also it is known that splice points and other sensitive locations frequently fail allowing the ingress of moisture with resulting deterioration of the cable system and without an alarm and detection system similar to the present invention, damage may occur to the cable for a considerable distance on either side of the fault before an outage indicates a fault has occurred and even then, location of the fault is often time consuming and difficult.

In addressing this problem the invention provides a special sensing device which is placed at these locations. At all critical points, such as cable splices, the sensor device, hereinafter referred to as a Splice Sentry Unit, is connected in parallel on the moisture detection line. The Splice Sentry Unit provides a sensing input which is tied to a separate length of moisture detecting conductors. The moisture detecting conductors are then placed appropriately inside of the splice closure or other sensitive cable system components and/or other locations. The output ports of the Sentry Unit are then bridged across the moisture detection line which extends back to the equipment office. Should water breach the protection at the location, the moisture detecting conductors are dampened and activate the electronics in the Splice Sentry Unit. When activated, the Splice Sentry Unit modulates the detection line with a coded signal. The coded signal is transmitted back along the detection line to the equipment office where it is intercepted by tuned line amplifiers and a moisture fault alarm results. The electronics in the equipment office decodes the incoming fault signal and displays the decoded information. The exact location of the fault is thus uniquely identified. The remote Splice Sentry Unit is powered by the detection line voltage. The device, unless triggered by the presence of moisture, appears as an open circuit on the line. Therefore, no standby current is drawn which would result in a false moisture alarm.

BRIEF DESCRIPTION OF THE DRAWINGS

In the drawings like characters of reference indicate corresponding parts in the different figures

DETAILED DESCRIPTION

Figure 1:
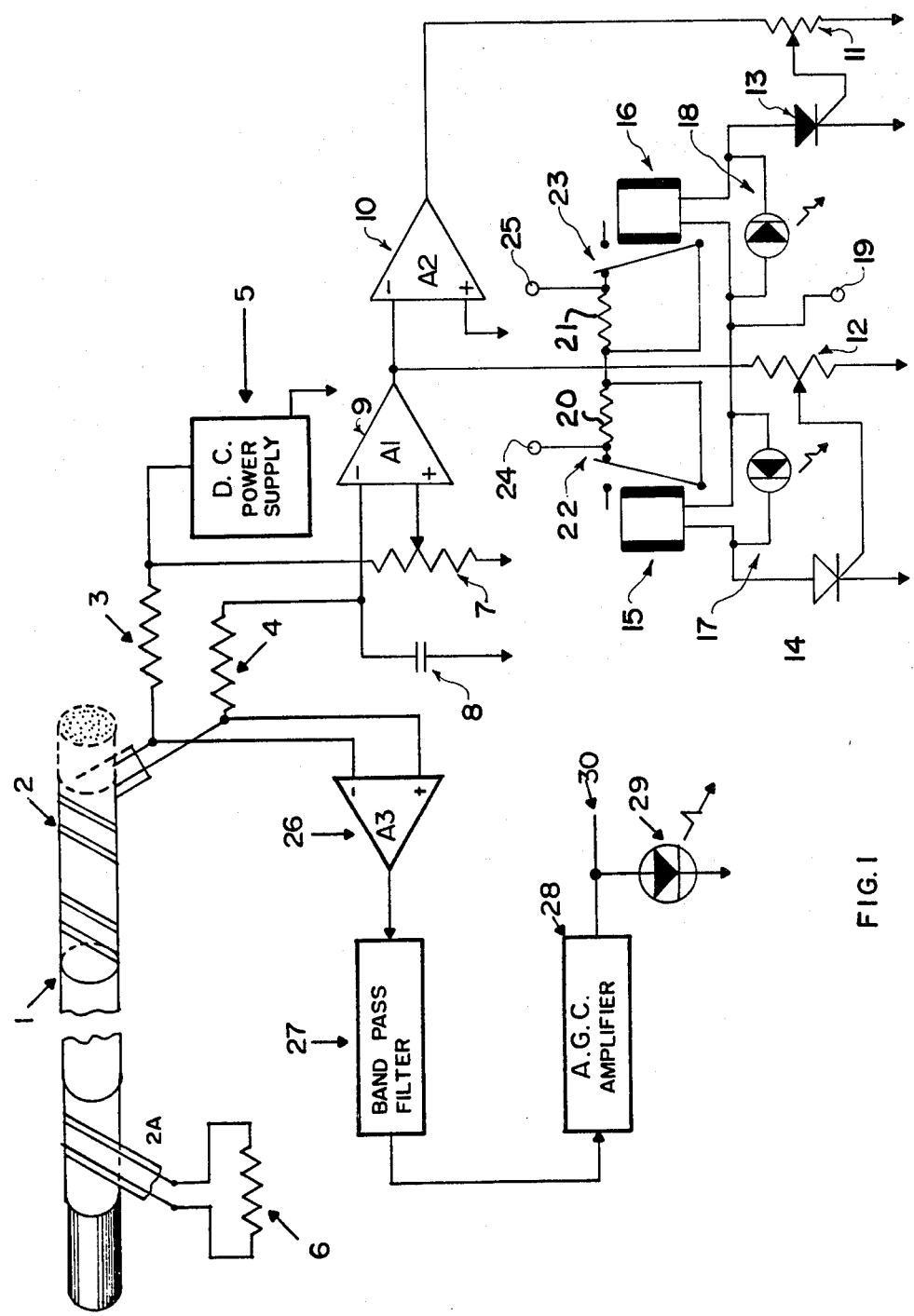
FIG. 1 is a schematic diagram showing the central station of an apparatus for monitoring the detection line current in a cable.
Figure 2:
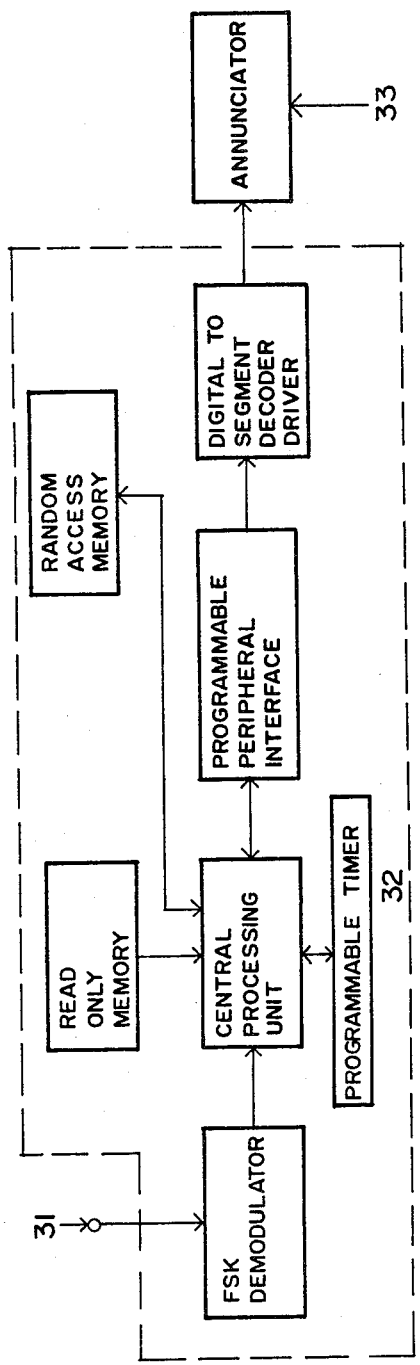
FIG. 2 is a schematic block diagram of the signal decoder of the central station of FIG. 1.
Figure 3:
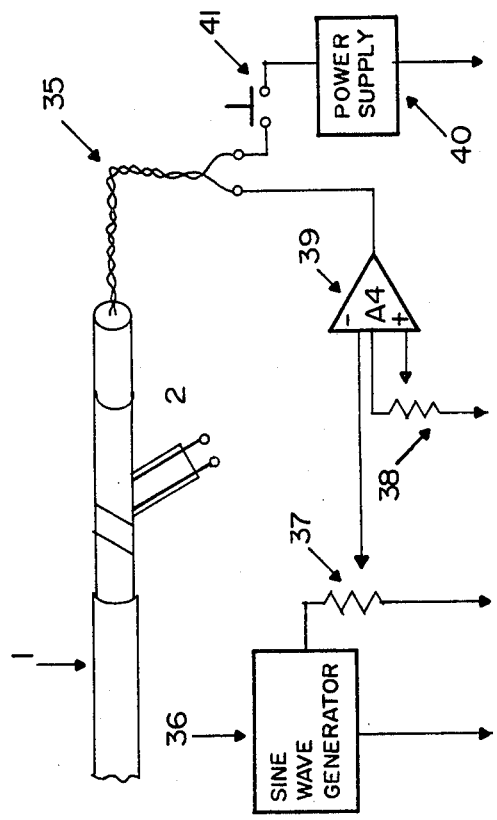
FIG. 3 is a schematic diagram of the line interrogation device of the central station of FIG. 1.
Figure 4:
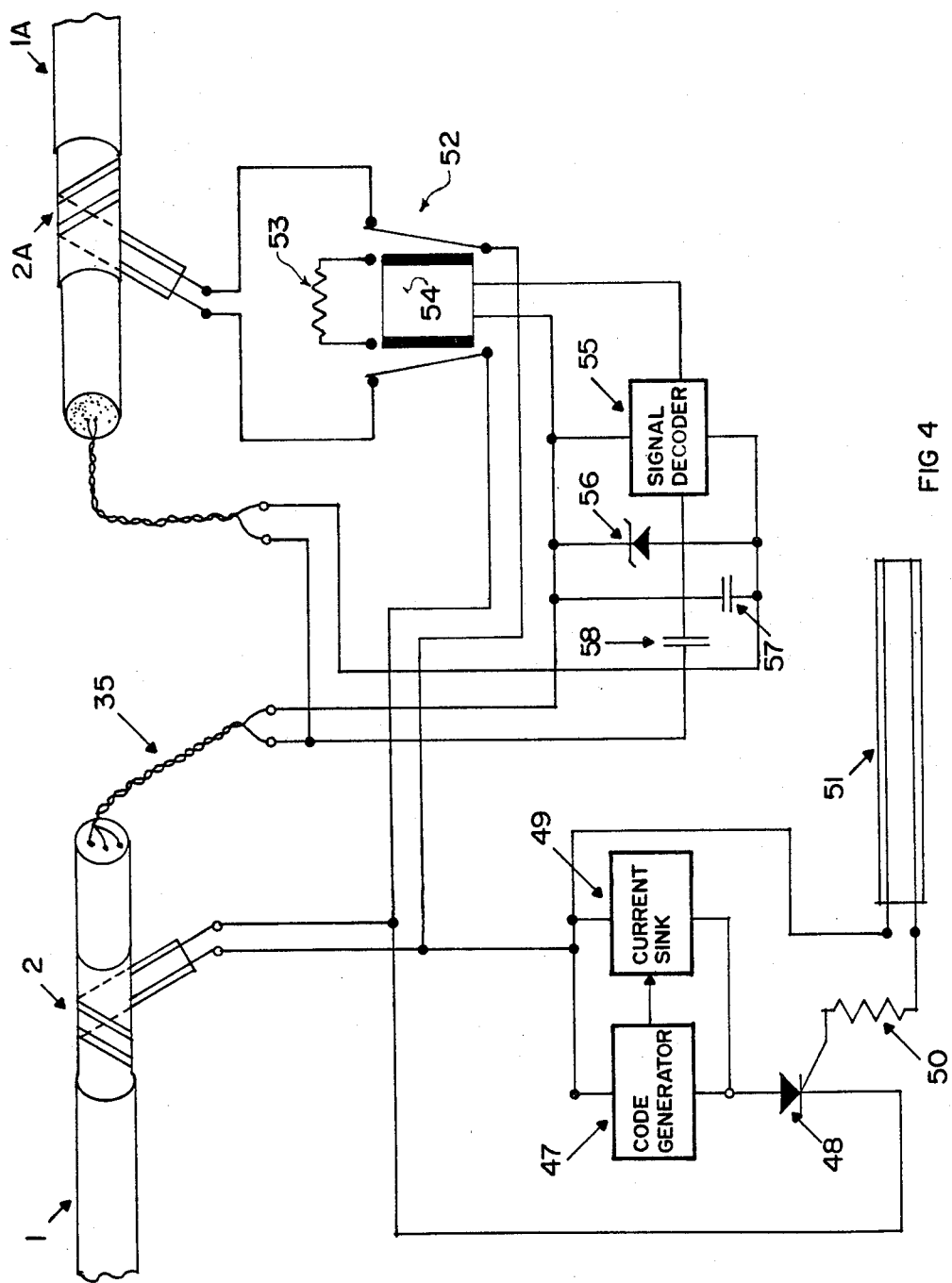
FIG. 4 is a schematic diagram of a remote station of the apparatus which may be installed at a remote location along a cable (Splice Sentry Unit).

The complete monitoring apparatus comprises a central station including a sensing and alarm system shown in FIGS. 1 and 2 and an interrogation device shown in FIG. 3. In addition the apparatus includes a plurality of remote stations one of which is shown in FIG. 4 with an expanded detail thereof shown in FIG. 5. The remote stations or splice sentry units include a moisture sensing and signalling section and also an interrogated disconnect section for coupling one portion of the main cable to that of another portion thereof.

An electrical cable 1 with a moisture detecting tape or line 2 helically wrapped around the outer layer of the cable core between the cable core and protective outer jacket is shown in FIG. 1. The moisture detection tape 2 with parallel and separate conductors is connected to the monitoring circuit through resistors 3 and 4. Input resistors 3 and 4 limit the direct line current and provide a suitable termination for any signalling currents. A regulated and protected DC power supply 5 provides a detection line voltage and powering for the remote station one of which is shown in FIG. 4 connected to a remote point on the electrical cable 1.

A termination resistance 6 at the end of the other detection line 2 establishes a nominal line current thus verifying line continuity. The line current develops a proportional voltage at the negative input of a summing amplifier 9. The voltage at the output of the amplifier 9 is reduced to zero for the nominal line current via an offset adjustment control 7 connected to the positive summing input of the amplifier 9 and the DC power supply 5. A filter capacitor 8, is connected from the negative summing input of the amplifier 9 to ground to bypass alternating current components of the signal. The output of the summing amplifier 9 is connected to the inverting input of a following summing amplifier 10 which exhibits unity gain. A decrease in line current such as caused by a line open will cause the output voltage of the summing amplifier 9 to go positive. This output voltage is connected to a variable resistor 12 which determines the threshold voltage from the output of amplifier 9 at which the silicon controlled rectifier (SCR) 14 will trigger. The loss of the detection line 2 current will result in the triggering of SCR 14 which causes a current to flow through a relay coil 15 and system fault indicator 17. The energizing of the relay coil 15 causes contacts 22 to open, introducing a resistance 20 at a pair of scan terminals 24 and 25 for the purpose of remote alarming. A system line fault is thus detected and alarmed.

An increase in detection line 2 current as caused by moisture on the detection line 2 will result in an increased voltage at the output of the unity gain amplifier 10. The output from amplifier 10 is connected to a variable resistor 11 which determines the threshhold voltage from the output of amplifier 10 at which an SCR 13 will trigger. An increase in detection line 2 current as a result of dampening of the detecting line 2 will cause the triggering of the SCR 13 which results in a current through a relay coil 16 and illustration of the moisture alarm indicator 18. The energizing of relay coil 16 causes a pair of contacts 23 to open introducing a resistance 21 at a pair of scan terminals 24 and 25 for the purpose of remote alarming. A moisture penetration fault is thus detected and alarmed.

A local audible alarm may be installed at the equipment office and connected in series with the alarm circuitry via a terminal 19.

Figure 5:
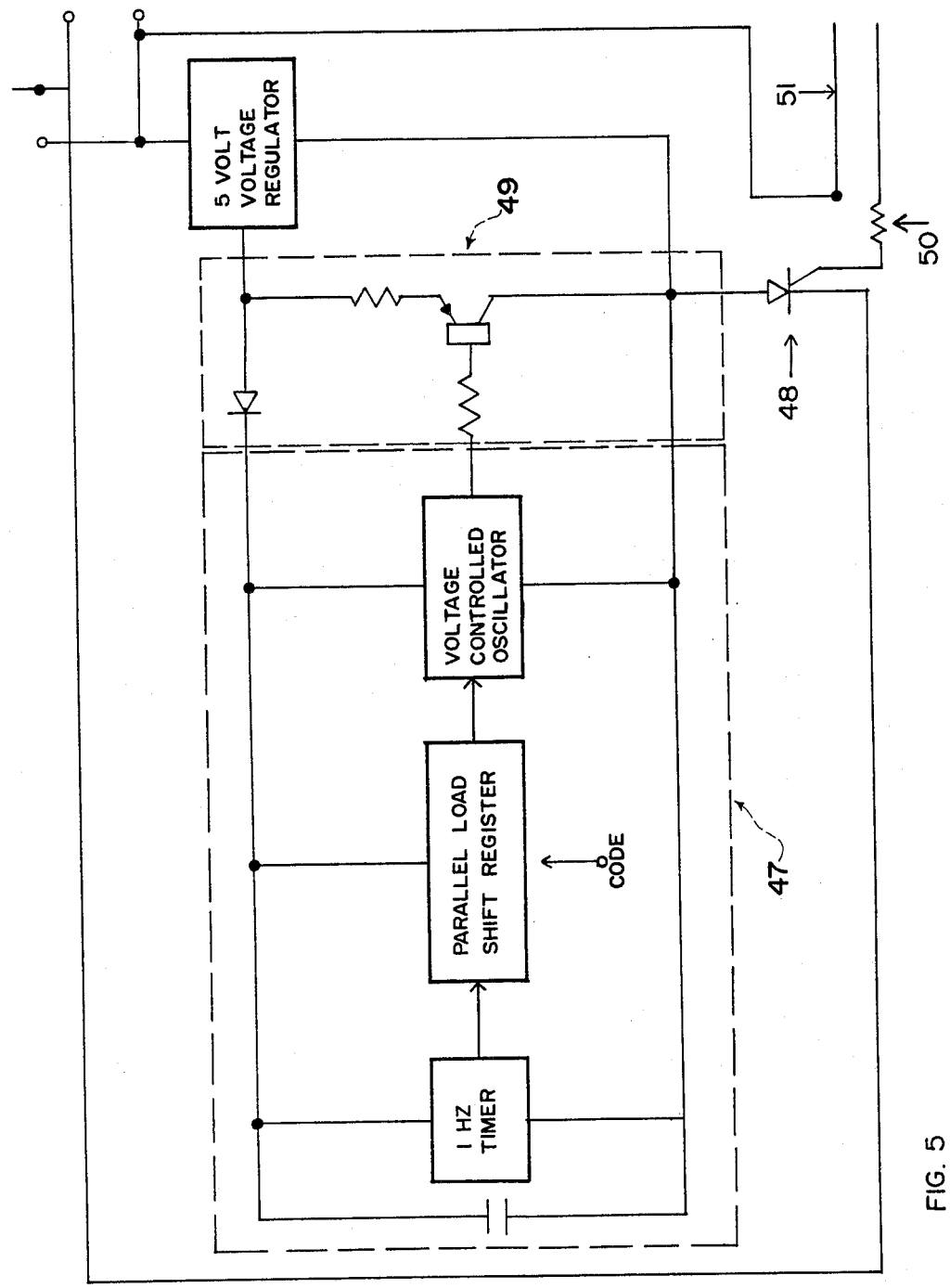
FIG. 5 is a schematic block diagram of the code generator and current sink portion of FIG. 4.

In the event of moisture penetration at a splice or other critical location at which a remote station as shown in FIGS. 4 and 5 is located, the remote station is activated as described in more detail hereinafter. The current drawn by the remote station therefore exceeds the preset maximum value and an alarm is signalled illuminating an indicator 18. The remote station also generates a coded signal which is transmitted down the detection line 2 to the equipment office. An instrument amplifier 26 (see FIG. 1) is connected across the conductors of the detecting tape 2 and intercepts the coded signal from the remote station (FIG. 4).

The instrument amplifier 26 increases the strength of the coded signal and rejects any unwanted common mode noise voltages on the moisture detection line 2. The output of the instrument amplifier 26 is applied to the input of an active band pass filter 27 which rejects all noise voltages outside of the frequency band of the code signals. A frequency range of 350 Hz to 650 Hz is selected as the preferable in-band range for the code signals. This frequency range is compatible with typical transmission characteristics of communication cable conductor pairs and the moisture detecting tape 2. The amplified signal from the instrumentation amplifier 26 and the band limited output from the active band pass filter 27 is connected to the input of an automatic gain control AGC amplifier 28.

The AGC amplifier 28 automatically adjusts its gain to the level of the incoming signal from the band pass filter 27 such that a constant output voltage is realized from the AGC amplifier 28. The dynamic range of the AGC amplifier 28 ensures a constant output voltage of 2 V RMS for a voltage level of 3 MV RMS to 3 V RMS at the input of the instrument amplifier 26 (these values as exemplary only).

The output of the AGC amplifier 28 drives an indicator 29 and is connected via a terminal 30 to the input terminal 31 of a signal decoder (FIG. 2).

FIG. 2 shows a conventional signal decoder generally designated 32 which uses a microprocessor with a pre-programmed memory to demodulate and interpret the signal. The output of the signal decoder 32 drives the code annunciator 33 which displays the signal code of the remote station that has alarmed. Additional digital signal output ports (not illustrated) are available from the signal decoder 32 for extension of the alarm to remote monitoring stations.

The moisture sensing and signalling section of the remote station (FIGS. 4 and 5) is comprised of four main components, namely, a code generator 47, a current sink 49, an SCR 48 and moisture detecting conductors 51. The remote action is connected in parallel across the moisture detecting line 2 of the communication cable. The remote station is illustrated in connection with a splice between two sections of the main cable 1, 1A including moisture detecting conductors 2, 2A respectively. However for convenience of illustration the detailed connections between the cables are omitted. The technique illustrated can of course also be used for connection of a branch cable into the main cable. The SCR 48 is in series with a conventional code generator 47 and current sink 49 (shown in more detail in FIG. 5) and, unless triggered by moisture on the detect conductors 51, prevents current from passing through the device.

Moisture dampening the dielectric of the conductors 51 results in a current through the conductors, current limiting resistor 50, and the input gate of the SCR 48. The SCR 48 turns on and the voltage on the cable detection line 2 is applied across the code generator 47 and current sink 49. It will be noted that FIG. 5 is a more detailed version of FIG. 4 including the SCR 48, resistance 50 and conductors 51. In addition, the code generator 47 and current sink 49 are shown in more detail. Specifically, the code generator 47 comprises a parallel load shift register, a timer and a voltage controlled oscillator (VCO). The load frequency from the timer is 1.0 Hz. The VCO is driven by the output of the shift register and thus produces a burst of FSK (Frequency shift keyed) coded information every second. It will be noted that FIG. 5 also shows the provision of a voltage regulator connected across the code generator 47 and current sink 49 to regulate the supply voltage from the conductors 2.

The code generator 47 therefore develops a predetermined FSK digitally encoded signal which is fed to and drives the current sink 49. The driven current sink 49 draws approximately 0 to 7 ma current between the cable detection tape conductors 2. As the impedance of the detection tape is in the order of 600 ohms, a resultant modulation wave form of about 4.2 volts peak to peak is impressed between the detection conductors 2. The wave form contains the coded information unique to that particular splice sentry unit and propagates back to the central station where it is detected. The signal decoder shown in FIG. 2 comprises an FSK demodulator and a central processing unit incorporating a read only memory, a random access memory and a programmable timer.

The central processing unit sends the signal to a programmable peripheral interface shown in the drawing schematically which in turn sends it to a digital to segment decoder driver also shown in the drawing schematically for subsequent display by the annunciator 33. The location of the fault is thus uniquely identified. In addition, as previously mentioned, the sensing section acts to draw current from the line 2 which is detected by the central station.

A moisture detection tape 2A of the remote section of cable 1A is spliced parallel to the main cable moisture detection tape, as shown in FIG. 4. The interrogated disconnect section of the remote station is placed at the splice to enable isolation and fault locating. At the control station a line interrogation device (FIG. 3) generates a modulated signal to power and activate the remote disconnect unit. The modulated signal is transmitted to the remote disconnect devices via a dedicated conductor pair 35 within the cable 1. A sine wave generator 36 of selected code frequency is connected to a modulation control 37. The adjustable output from the modulation control 37 is connected to the negative input of a summing amplifier 39. A line current bias control 38 is connected to the positive input of the summing amplifier 39 and controls the direct line current through the interrogation pair conductors 35. The power supply 40 provides the DC potential enabling the nominal line current. The interrogation line current is set at 16 ma (for example) which series powers the remote disconnect devices. Depressing the interrogation switch 41 completes the circuit and composite powering and modulation currents excite the conductors of the interrogation conductor pair 35. The selected frequency signal output from the summing amplifier 39 has a peak to peak amplitude of approximately 5 volts.

The composite signal from the line interrogation unit (FIG. 3) propogates down the interrogation pair 35 to the location of the remote disconnect device (FIG. 4). The interrogation conductor pair 44 series powers and parallel signals the remote disconnect device (FIG. 4). The direct powering current of approximately 16 ma develops an approximate 5 volt potential across the zener diode 56 and filter capacitor 57. The 5 volt potential powers a signal decoder device 55. The coded alternating signal is coupled to the input of the signal decoder 55 through the DC blocking capacitor 58. If the signalling frequency at the input corresponds to the preset code frequency of the signal decoder a voltage potential of about 5 volts is developed across the relay coil 54. The energized relay coil causes the relay contacts 52 to pull in. The moisture detection conductor 2A is therefore disconnected from the detection conductors 2 which are terminated by a precision resistance 53.

The moisture detection conductors 2 from the incoming cable 1 are thereby isolated from the moisture detection conductors 2A on the outgoing branch cable portion 1A.

Finally, it should be noted that although the device and system herein described, teaches a particular method of signalling and coding, it will be appreciated that the system can readily be modified to send and interpret signals by analogue, digital and other well known modulation schemes, all apparent to those skilled in the art to which the invention relates.

Since various modifications can be made in my invention as hereinabove described, and many apparently widely different embodiments of same made within the spirit and scope of the claims without departing from such spirit and scope, it is intended that all matter contained in the accompanying specification shall be interpreted as illustrative only and not in a limiting sense.

What I claim as my invention is:

1. Apparatus for monitoring an electrical cable along its full length and at a plurality of specific points along its length comprising a pair of separate conductors installed along the full length of the cable, dielectric insulating means between the two conductors arranged such that the presence of moisture adjacent the conductors reduces the resistance of the insulating dielectric between the two conductors, a source of electric power connected across the conductors whereby the reduced resistance causes an increased current in the conductors, a plurality of electronic detection means each arranged at a respective one of the specific points and each including means for detecting the presence of moisture at the specific point, means responsive to the detection of the presence of moisture for developing an AC signal indicative of the specific point concerned and terminal means for connecting the AC signal across said pair of conductors and central electronic detection means connected to said conductors including first means responsive to said increased current, second means responsive to said AC signals and indicating means responsive to said first and second means for signalling the presence of moisture.

2. The apparatus according to claim 1 wherein each of the electronic detection means includes means connected to said connectors for extracting electric power from said source for developing said AC signal.

3. The apparatus according to claim 1 in which each of said electronic detection means comprises code generating means, means connecting the moisture detecting means to said code generating means and means in series with said code generating means for preventing current passing through said code generating means unless said moisture detecting means is activated.

4. The apparatus according to claim 1 in which each of said electronic detection means includes a pair of separate conductors installed at the respective specific point and dielectric insulating means between the two conductors arranged such that the presence of moisture adjacent the conductors reduces resistance of the insulating dielectric between the two conductors.

5. The apparatus according to claim 1 including means connecting the pair of separate conductors such that the source of electric power develops a current through the conductors and wherein the central electronic detection means includes means for detecting a reduction in said current.

6. The apparatus according to claim 5 in which said central electronic detection means is remotely situated from said electrical cable being monitored, said indicating means including a first summing amplifier operatively connected to the distal ends of said pair of separate conductors, a following summing amplifier, the output of the first summing amplifier being connected to the inverting input of the following summing amplifier, relay coil means and systems for indicator means operatively connected to the output of said first summing amplifier, said relay coil means being connectable to remote alarm means, arranged such that said reduction in the current operatively connects said first amplifier to said fault indicating means and to said relay coil means, further relay coil means and further system fault indicator means operatively connected to the output of said following summing amplifier, said further relay coil means being connectable to further remote alarm means, arranged such that said current beyond a predetermined amount operatively connects said following summing amplifier to said further fault indicator means and to said further relay coil means.

7. The apparatus according to claim 1 including branch cable monitoring means operatively connected in parallel to said pair of separate conductors, a remote disconnect device operatively connected between said branch cable monitoring means and said pair of separate conductors, said electronic detection means including means for generating a coded signal to said remote disconnect device for actuating same for disconnecting said branch cable monitoring means from said pair of separate conductors.

8. The apparatus according to claim 7 including dedicated cable means operatively connecting said remote disconnect device to said central electronic detection means.

9. The apparatus according to claim 4 including branch cable monitoring means operatively connected in parallel to said pair of separate conductors, a remote disconnect device operatively connected between said branch cable monitoring means and said pair of separate conductors, said electronic detection means including means for generating a coded signal to said remote disconnect device for actuating same for disconnecting said branch cable monitoring means from said pair of separate conductors and including means to connect the ends of said pair of separate conductors together at the location of said remote disconnect device whereby said current is maintained through said connecting means.

* * * * *